United States Patent [19]

Hestevik et al.

[11] Patent Number: 5,290,606
[45] Date of Patent: Mar. 1, 1994

[54] METHOD FOR MANUFACTURING A SUBSTRATE FOR A PRINTED CIRCUIT BOARD

[76] Inventors: Svein Hestevik, Bilterudbråten, N-1550 Hølen; Tore Storfossene, N-3640 Skollenborg, both of Norway

[21] Appl. No.: 43,597

[22] Filed: Apr. 5, 1993

Related U.S. Application Data

[63] Continuation of Ser. No. 721,648, Jul. 29, 1991, abandoned.

[30] Foreign Application Priority Data

Jan. 30, 1989 [NO] Norway .................... 89 0377

[51] Int. Cl.$^5$ ............................................. B05D 1/08
[52] U.S. Cl. ................................ 427/453; 427/454; 427/455; 427/535; 427/576; 427/96; 427/126.4; 427/387; 427/404; 427/409; 427/419.1; 51/320
[58] Field of Search ............... 427/96, 126.4, 387, 427/404, 409, 419.1, 453, 454, 455, 535, 576; 51/321

[56] References Cited

U.S. PATENT DOCUMENTS

| | | |
|---|---|---|
| 3,607,381 | 9/1971 | Fairbairn . |
| 4,031,268 | 6/1977 | Fairbairn ........................ 427/423 |
| 4,294,009 | 10/1981 | Quintin et al. .................. 29/832 |
| 4,444,804 | 4/1984 | Ferrari ............................ 427/423 |
| 4,675,784 | 6/1987 | Dahlberg et al. ............... 361/386 |
| 4,864,106 | 9/1989 | Lorenz et al. ................... 219/543 |

FOREIGN PATENT DOCUMENTS

| | | |
|---|---|---|
| 0048992 | 4/1982 | European Pat. Off. . |
| 3447520 | 4/1986 | Fed. Rep. of Germany . |
| 3527967 | 2/1987 | Fed. Rep. of Germany . |
| 3625087 | 1/1988 | Fed. Rep. of Germany . |
| 3641202 | 6/1988 | Fed. Rep. of Germany . |
| 8306874-2 | 2/1985 | Sweden . |

OTHER PUBLICATIONS

Plastic Coatings for Electronics, McGraw Hill, 1970 pp. 46–47.
Condensed Chemical Dictionary, 10th ed. pp. 919, 921, 922 (1981).

*Primary Examiner*—Terry J. Owens
*Assistant Examiner*—Benjamin L. Utech
*Attorney, Agent, or Firm*—Finnegan, Henderson, Farabow, Garrett & Dunner

[57] ABSTRACT

In a method for the manufacture of a substrate for electrical components, a base of metallic material is first sandblasted and thereafter coated by means of a thermal process with a bonding layer of, for example, copper powder. Then the bonding layer is coated with a dielectric layer of a ceramic material, which also is applied by means of a thermal process, and the ceramic material is thereafter impregnated with silicone oil. Finally, the ceramic layer is provided with an electrical conducting layer, also by means of a thermal process, having a predetermined electrical conducting pattern and the finished substrate is cleaned by blasting it with glass spheres.

13 Claims, 3 Drawing Sheets

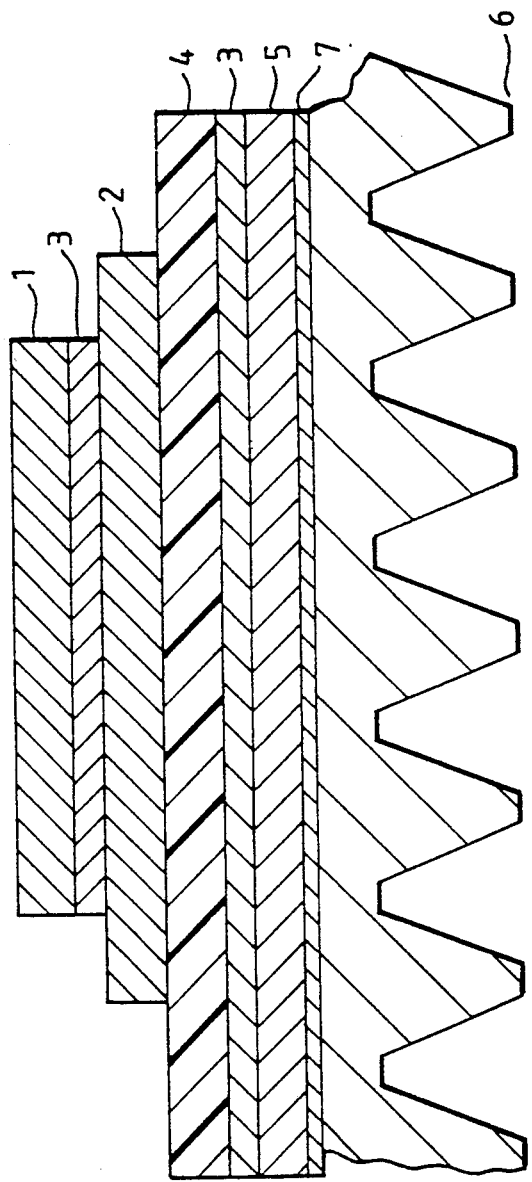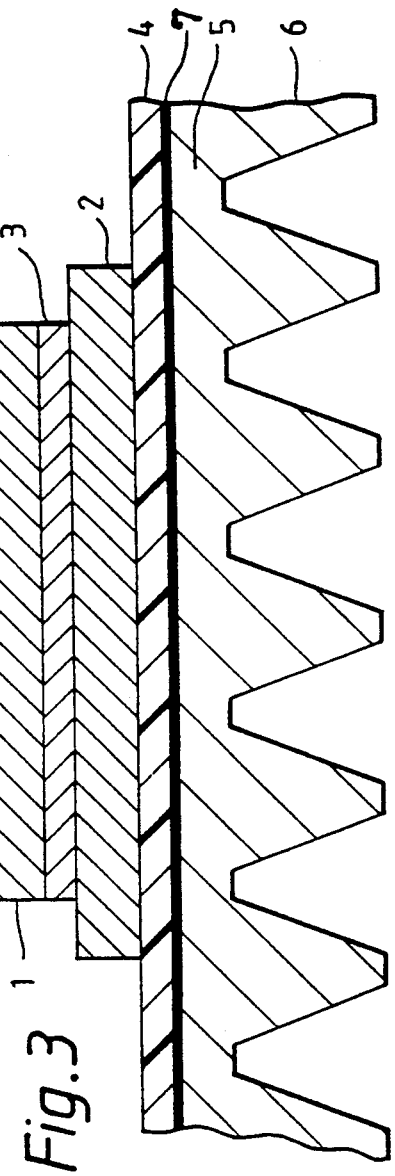

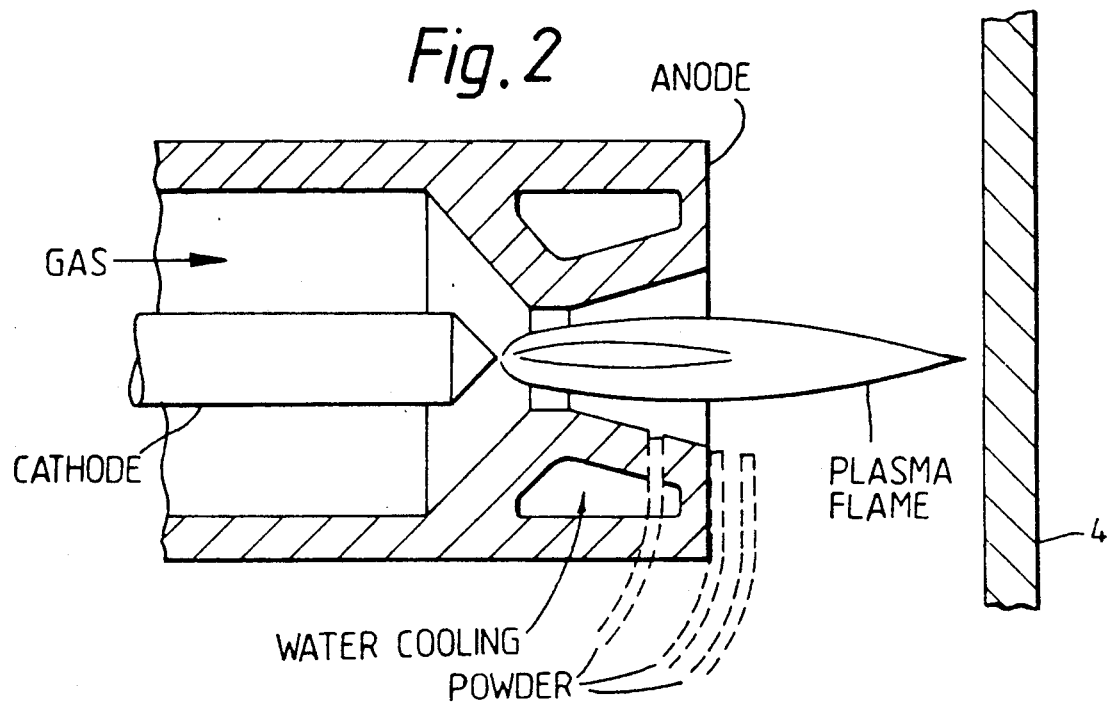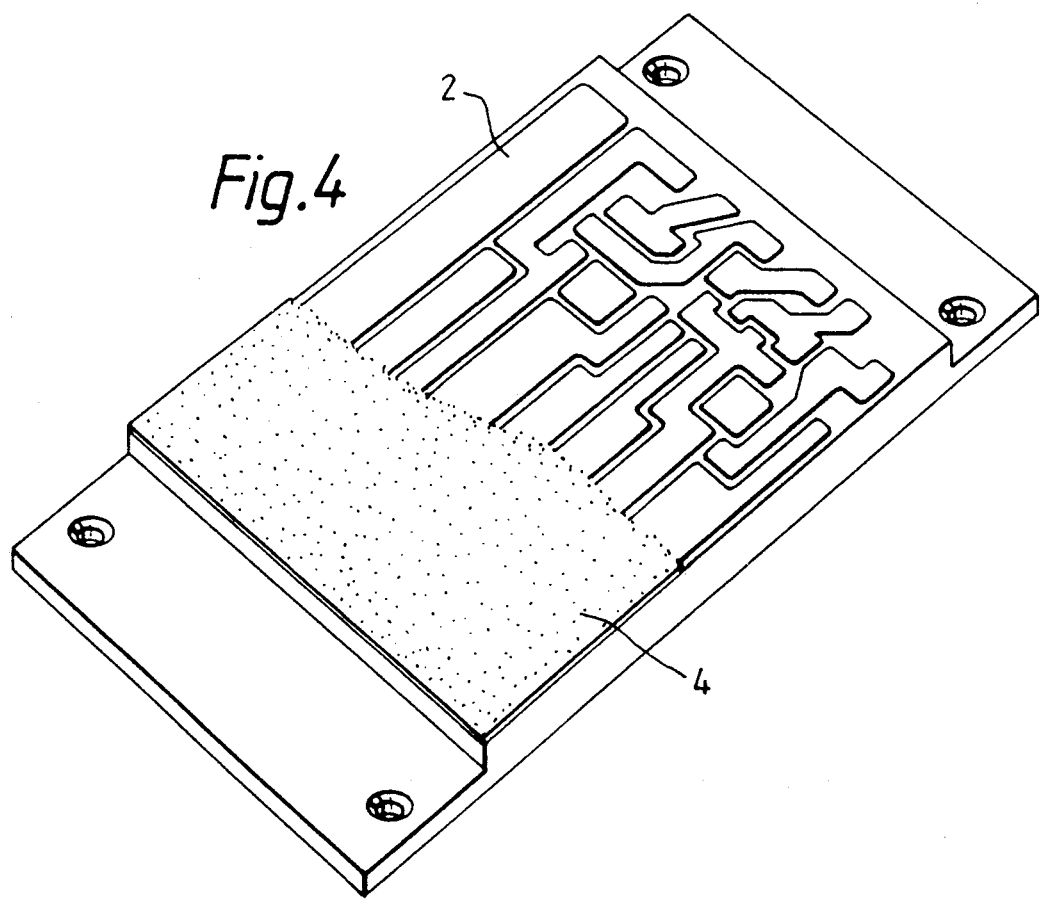

METHOD FOR MANUFACTURING A SUBSTRATE FOR A PRINTED CIRCUIT BOARD

This application is a continuation of application Ser. No. 07/721,648, filed Jul. 29, 1991, now abandoned.

BACKGROUND OF THE INVENTION

The invention relates to a method for manufacturing a substrate for the placement of electrical and/or electronic components thereon. Particularly the method according to the present invention concerns the manufacture of substrates with good thermal and mechanical properties that are especially suited for use in hybrid modules for power electronics.

In practice, a substrate of the above-mentioned type has the same function as a printed circuit board. Common printed circuit boards for placement of electronic components are usually manufactured of an epoxy material on which is provided a predetermined electrical conducting pattern by means of electroplating. For economical reasons and to reduce the requirement for space, the conducting pattern is usually provided on both sides of the board and the electrical conducting connection between the conducting pattern on each side is provided by through-plated holes in the epoxy substrate. Such circuit boards are however best suited for electronic equipment where low voltages and small currents are used and where the equipment is not subjected to mechanical and thermal loads to any degree.

Substrates for use in electrical engineering or electronics where high voltage and large currents are used and where the equipment further may be subjected to large mechanical and thermal loads are often metallic substrates for instance in form of a sheet of steel and aluminium in order to achieve good thermal conduction and sufficient mechanical strength. Electrical isolation between the conducting pattern and the metal substrate is provided by coating it with an isolating layer, for instance in the form of a enamel coating, alumina coating or a combination of oxides, nitrides of carbonitrides. The isolation layer may also be generated by applying an epoxy resin layer to the metal substrate. The electrical isolating layer may be applied on both sides of the metal substrate or only on one side, the substrate it will be used in modules of power electronics, the metal substrate in that case usually is provided with or has cooling ribs on the other side in order to transport heat away. The electrical isolation layers are provided with an electrical conduction pattern or current leads by means of different processes, for instance by chemical methods or by vapour deposition. Examples of circuit boards of this type are for instance disclosed in DE-PS 3447520 and DE-OS 2556826.

From GB-PS 2110475A there is further known the use of a substrate in the form of an alloy of Fe, Cr, Al and Yt where a ceramic surface layer is formed by the substrate being heated in an oxidizing atmosphere.

The known circuit boards or substrates as well as the methods used in their manufacture are however burdened with a number of disadvantages. Different processes are used in application of the isolating and the conducting layer and those processes are often of such a nature that they in a negative way influence the properties of already applied coatings. It has proved to be difficult to achieve dielectric layers with satisfactory dielectric, thermal and mechanical properties and when these properties then are influenced in a negative way by the process of applying a conducting pattern or by soldering of components thereto, the finished product hardly meets the requirements that are demanded of it e.g. hybrid modules in power electronics. It is for instance difficult to achieve a satisfactory bond between the different layers or the isolating layer and the metal substrate which forms the core or base the dielectric strength of the electrical isolating layer is not as good as desired. One solution might be to increase the thickness of the electrical isolating layer, but this is an expensive solution and in the case of ceramic coatings it does in any case not lead to any improvement, as the coatings usually are brittle and have a relatively low tensile and shear strength, although they are hard materials and in theory have a high dielectric strength. The last property however is reduced due to the formation of pores and impurities caused by migration. It has also turned out that ceramic layers applied by means of, for instance, plasma spraying do not attain better dielectrical properties if the thickness is increased beyond 0.3 mm. In addition the use of different processes for applying the separate layers to the metal substrate insert and impairs manufacturing economy.

The object of the present invention therefore is to avoid the above-mentioned disadvantages, by providing a method for the manufacture of substrates having high mechanical and dielectrical strength and that are able to sustain great thermal loads and in which the same process may be used for coating a base, preferably of a metallic material, with both the electrical isolating and conducting layers.

SUMMARY OF THE INVENTION

In accordance with the present invention a method is provided for the manufacture of a substrate for the placement of electrical and/or electronic components thereon, the substrate at least comprising a base, preferably formed of a metallic material, which may constitute a part of or be integrated into a more comprehensive structure, a dielectric layer and an electrical conducting layer having a predetermined conducting pattern, characterized in that the method comprises the following successive steps:

a) sandblasting the surface of the base with grains of $Al_2O_3$ (alumina),
b) coating the sandblasted surface of the base with a bonding layer by means of thermal coating process,
c) coating the bonding layer with a dielectric layer by means of a thermal coating process, the dielectric layer being formed of a ceramic material,
d) impregnating the dielectric layer formed of the ceramic material with silicone oil,
e) coating the dielectric layer with an electrical conducting layer by means of a thermal coating process, a template being used to form the predetermined pattern, and
f) cleaning the surfaces of the dielectric layer and the electrical conducting layer by blasting them with spheres of glass.

BRIEF DESCRIPTION OF THE DRAWINGS

The method will be explained in connection with the following drawings in which.

FIG. 1 shows a section of a substrate according to the prior art.

FIG. 2 shows schematically a plasma spray gun used with the method according to the present invention.

FIG. 3 shows a section of the substrate manufactured according to the method of the present invention.

FIG. 4 shows the application of an electrical conducting layer in the form of a conducting pattern.

In FIG. 1 there is shown a substrate according to the prior art with a transistor matrix 1 mounted on a conducting layer 2 by means of a conducting adhesive 3 or by soldering. Many different layers which make up the substrate are applied by means of different processes and the isolation 4 layer is for instance glued to the base 5, while the heat sink or the cooling body 6 is a separate component. The method according to the present invention is described in connection with the manufacture of a substrate for one sided placement of components as shown in section FIG. 3. The thermal coating process used in the following example is plasma spraying. The base 5 which may be a metal sheet, preferably of steel, aluminium or copper, is cleaned or degreased on that side of the surface which is to be coated with the isolating layer 4 by being sprayed with trichlorethene acetone or the like. Then the surface is sandblasted in a first process step with alumina ($Al_2O_3$), for instance "METCOLITE" alumina grit with a grain size of "0.2–0.8μm". The process parameters used in this step may for instance be:

Figure 5:
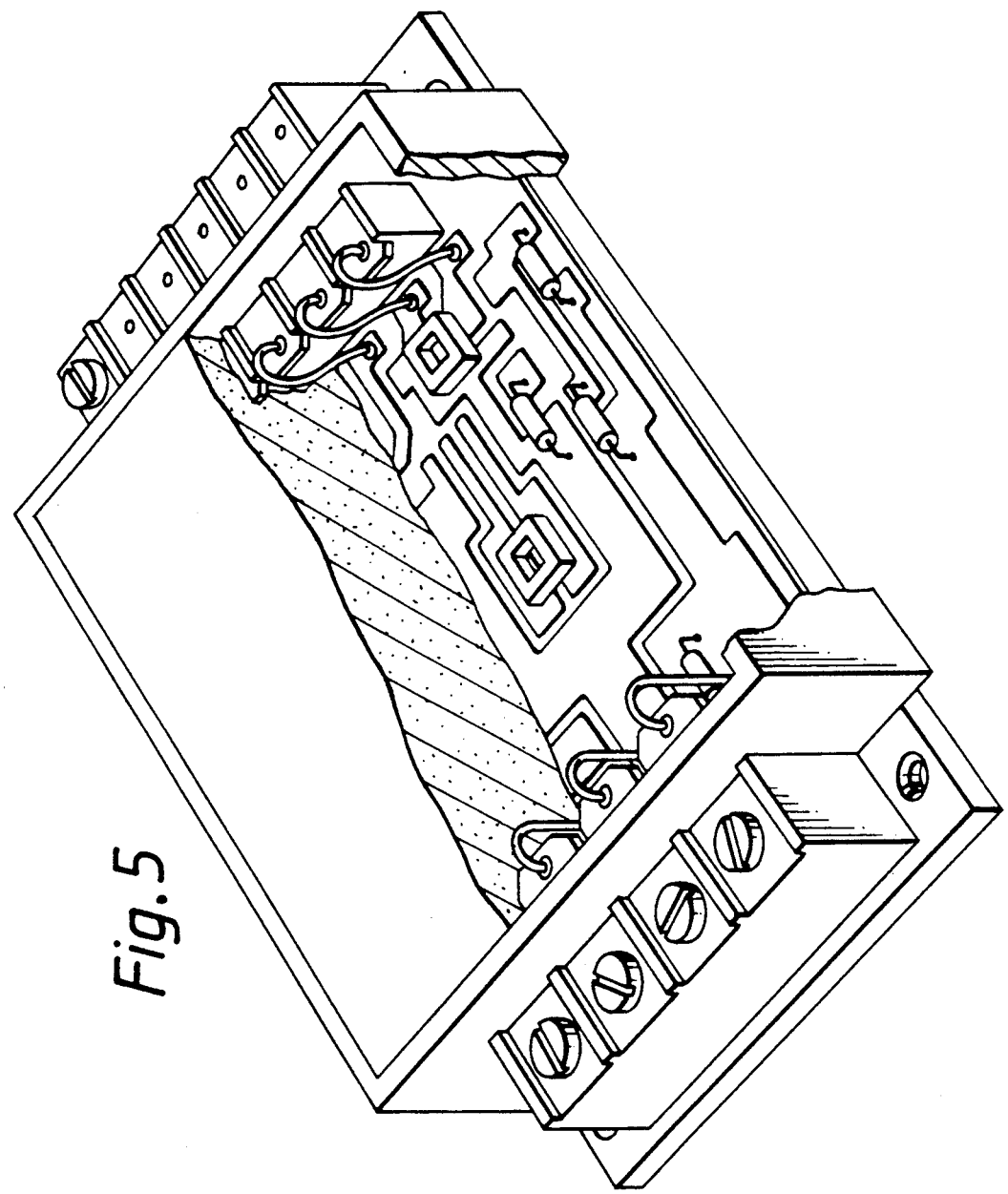
FIG. 5 shows in perspective and with a partly exposed substrate, a completed, mounted hybride module for power electronics.

| Blasting pressure | 3–6 bar |
| --- | --- |
| Nozzle diameter | 4–8 mm |
| Distance | 100–200 mm |
| Blasting angle | 60–90° |
| Surface roughness | 20 μm (mean) |

The same blasted surface must immediately thereafter be cleaned of dust by blasting with completely dry and greasefree compressed air or nitrogen gas.

In the next process step which takes place at the most 1 to 2 hours after the sandblasting, the surface is coated with a bonding layer 7 and means of plasma spraying. The objective of the bonding layer 7 is to function as a carrier for the ceramic layer 4 which constitutes the dielectric coating. The bonding layer 7 is preferably made of copper powder of the type PT2901, METCO 56 or the like. The copper powder is sprayed in a plasma process with the use of 9 plasma gun of a type shown schematically in FIG. 2. In this process step the substrate, i.e. The work piece, or the pistol is moved with a velocity of 1 m/s. At the same time the plasma spray gun is continuously moved in a direction at right angles to the substrate with a speed of 5 mm per pass. The bonding layer 7 is applied to a thickness of 0.05–0.15 mm, the applied thickness in each pass being 15 μ. The parameters used in this process step are:

| Current strength | 300–500 A |
| --- | --- |
| Voltage | 50–65 V |
| Distance (approximate) | 150 mm |
| Argon gas feed | 50–70 l/min |
| Hydrogen gas feed | 6 l/min |
| Powder feed | 50 g/min |

A dielectric layer 4 of ceramic material is now applied in a consecutive process step immediately after application of the bonding 7. The ceramic layer 4 consists of alumina alternatively mixed with 25% zirconia. The grain size is typically 10–110 μm, for instance by use of METCO 105 SFP Alumina powder. If the ceramic layer 4 is spray coated with a metal layer, a composition of 25% by weight zirconia ($ZrO_2$) is used. The parameters used in this process step are:

| Current strength | 550–1000 A |
| --- | --- |
| Voltage | 50–75 V |
| Distance | 90–110 mm |
| Argon gas feed | 30–40 l/min |
| Hydrogen gas feed | 50–20 l/min |
| Powder feed | 20–1100 g/min |
| Passage thickness | 2–15 μm |
| Layer thickness | 0.3 mm |

During application of the ceramic layer 4 the temperature of the substrate must be between 50°–150° C. This is easily achieved by the substrate being force-cooled with air.

In the following process step the ceramic layer is impregnated in order to achieve the desired dielectrical properties. As the substrate temperature is below 50° C., but above the room temperature silicone oil, preferably of the type BAYSILONE 100 is applied with a suitable tool as a brush, spray gun etc., to form a visible, shiny film which can be seen all over the surface. On application, the silicone oil is absorbed into the ceramic layer 4, while excess silicone oil is removed from the surface for instance by use of a moisture absorbent, porous paper. This paper is pressed two to five times against the surface, so that in the end there is no visible silicone oil.

In a subsequent process step the dielectric layer now is coated with a conducting pattern or a current lead pattern of copper. This must take place within one hour after the plasma spraying of the ceramic material. A desired conducting pattern is achieved by plasma spraying a copper powder through a template of stainless steel in the form of a sheet of 2 to 3 mm thickness, in which the desired conducting pattern beforehand has been cut beforehand by means of a laser. It is to be understood that the conducting pattern is determined by the electrical function to be realized by the substrate. The distance between the template and the ceramic layer must be between 0.5 and 1 mm. The substrate with the ceramic coating is preheated by means of plasma to about 50° C. by using the same plasma gun which was used for spraying. The same copper powder is used for the conducting pattern, i.e. The electrical conducting layer 2 as for the bonding layer, i.e. PT 2901 or Metco 56 copper powder or the like. The parameters for the spraying velocity and the vertical feed are also the same as for the bonding layer. The parameters used in this process step are:

| Current strength | 300–500 A |
| --- | --- |
| Voltage | 50–65 V |
| Distance | 150 mm |
| Argon gas feed | 50–70 l/min |
| Hydrogen gas feed | 5 l/min |
| Powder feed | 50 g/min |
| Passage thickness | 0.05–0.15 mm |
| Layer thickness | 0.1–1 mm |

The copper layer may be sprayed to the desired dimension or with an 0.1 mm excess. In the last case the layer is smoothed or made plane by grinding, milling or comparable processes.

In the final process step the substrate is cleaned, to remove possible copper dust. This is done by blasting it with small glass spheres in a separate chamber in order to avoid silicone pollution of the conducting pattern. Care must be taken in this process, where the parameters used are:

| | |
|---|---|
| Pressure | 2–5 bar |
| Nozzle diameter | 1–6 mm |
| Distance | abt. 150 mm |
| Sphere diameter | 50–100 μm |

By the method disclosed in the above example a substrate is provided that is very well suited for use in the production of for instance hybride modules for power electronics, but which also may be employed generally in electronics where substrates of high mechanical strength and excellent thermal and dielectric properties are desired. Further such substrates may be used in non-traditional applications in electrical engineering and in that connection possibly included as an integrated part of a more comprehensive electronic and mechanical equipment. The metallic base 5 may then for instance be a part of the construction itself and coated with the dielectric layer 4 by means of plasma spraying in situ for later placement of electrical or electronic components.

A substrate manufactured as specified above is very well suited for use in an automatic production process for the manufacture of miniaturized hybrid circuit modules in the form of ready made packages. The achieved reduction of costs in this connection amounts to about 20% to traditional methods and results from the manufacture of a circuit package in a volume reduction of up to 70%. The manufacturing method is also well suited for the production of custom specified circuits and offers good possibilities for a possible optimization of the circuit module, while the specific demands for mechanical and thermal properties may be achieved. It has thus been shown that the method is well suited to small production volumes with a frequent change of the circuit pattern, as the initial costs are low.

The economical and process engineering advantages are first and foremost achieved by the coating being based on the use of a thermal coating process, e.g. plasma spraying or jet coating. Besides it is well known to use thermal coating processes in the mechanical industry for instance for coating metals with wear resistant coatings of ceramic material. By integrating the ceramic coating 4 with a bases of metallic material, good heat conducting properties are achieved and when the thermal coating process also is used for applying the electrical conducting coating 2 in the form of predetermined conducting patterns, a substrate with excellent thermal conducting properties results.

For the coating there may be used different thermal processes. It has shown to be particularly advantageous to use plasma spraying for applying the ceramic coating 4. It is then formed a ceramic coating with 5% pore volume and 5% oxide (volume). It is however desired that the conducting coating 2 and which cannot be impregnated, has greater density and lower oxide content. This is advantageously achieved by the conducting layer being applied by means of jet coating, for instance with a Metco "Diamondjet", which is a high velocity oxy fuel flame coating piece of equipment or NVOA which produces a conducting layer with only 2% pore volume and 2% oxide volume.

Moreover it will be obvious that by jet coating, where high speed jet combustion gases from the combustion of for instance propane are used, the parameters of current strength, voltage and gas feed given in the relevant process example do not apply.

Although a substrate made according to the above-mentioned example only can be used for one sided mounting of components, it has been shown that it has a lower cost per area unit than conventional double-sided circuit boards of epoxy resin, when the price of the metal base used is ignored as the metal base possibly could be part of a more comprehensive structure where the electrical or the electronic components are used.

By means of the method according to the invention there are thus provided a substrate with a thermal resistance of 0.6 C/W (computed), when a 10 mm base of aluminum is used, a volume resistivity of $25.0^{12}$ phm/m$^2$ with a thickness of the ceramic layer of 0.3 mm, a dielectric strength of 3000 V for the same thickness of the ceramic layer and an electrical conductivity of the plasma sprayed copper layer of 40 to 50% to that of pure copper, but which is 1000 times greater than the conductivity of a thickfilm paste.

The use of a thermal process in the application of the ceramic coating has shown to be very well compatible with different base materials and when a thermal coating process also is used for applying conducting patterns, it may easily be integrated with various technologies and methods for the mounting of components.

It must be noted that even though the method of manufacturing the dielectric layer in the form of a ceramic coating according to the invention is used in connection with substrates for placement of electrical and/or electronic components, persons skilled in the art may easily realize that such coatings also may be use din quite different technical and industrial contexts.

We claim:

1. A method for the manufacture of a substrate for electrical components, the substrate comprising a metal base, a dielectric layer and an electrical conducting layer having a conducting pattern, said method comprising the following successive steps:
   a) sandblasting the surface of the metal base with grains of alumina;
   b) within two hours after step a), coating the sandblasted surface of the base with a bonding layer by a thermal spray coating process;
   c) coating the bonding layer with a dielectric layer of a ceramic material by a thermal spray coating process;
   d) impregnating the dielectric layer of ceramic material with silicone oil by applying the silicone oil on the surface of the dielectric layer so that there is formed thereon a visible film of said oil and immediately thereafter removing the oil from the surface so that the visible film of silicone oil is no longer present;
   e) heating the dielectric layer to about 50° C.;
   f) coating the dielectric layer with an electrical conducting layer by a thermal spray coating process, said conducting layer having an electrical conducting pattern; and
   g) cleaning the exposed surfaces of the dielectric layer and the electrical conducting layer by blasting them with glass spheres.

2. The method of claim 1, wherein the thermal coating processes are by plasma spraying.

3. The method of claim 1, wherein the thermal coating processes are by flame jet coating.

4. The method of claim 1, wherein plasma spraying is used in step c) and flame jet coating in step f) as the thermal coating process.

5. The method claim 1, wherein the bonding layer is formed of a copper powder.

6. The method of claim 1, wherein the dielectric layer is formed of alumina powder.

7. The method of claim 1, wherein the dielectric layer is formed of a mixture of alumina powder and zirconia powder.

8. The method of claim 7, wherein the layer contains 25% by weight of the zirconia powder.

9. The method of claim 1, wherein the dielectric layer is heated in step e) with a plasma gun.

10. A method for the manufacture of a substrate for electrical components, the substrate comprising a metal base, a dielectric layer and an electrical conducting layer having a conducting pattern, said method comprising the following successive steps:

a) coating the metal base with a dielectric layer of a ceramic material by a thermal spray coating process;

b) impregnating the dielectric layer of ceramic material with silicone oil by applying the silicone oil on the surface of the dielectric layer so that there is formed thereon a visible film of said oil and immediately thereafter removing the oil from the surface so that the visible film of silicone oil is no longer present;

c) heating the dielectric layer to about 50° C; and d) coating the dielectric layer with an electrical conducting layer by a thermal spray coating process, said conducting layer having an electrical conducting pattern.

11. The method of claim 10, wherein the metal base is first coated with a bonding layer by a thermal spray coating process before it is coated with the dielectric layer.

12. The method of claim 11, wherein the metal base is first sandblasted with grains of alumina and is then coated with said bonding layer within two hours.

13. The method of claim 10, including cleaning the exposed surfaces of the dielectric layer and the electrical conducting layer after step (d) by blasting them with glass spheres.

* * * * *